(12) United States Patent
Buynoski et al.

(10) Patent No.: US 6,225,667 B1
(45) Date of Patent: May 1, 2001

(54) LEAKY LOWER INTERFACE FOR REDUCTION OF FLOATING BODY EFFECT IN SOI DEVICES

(75) Inventors: Matthew S. Buynoski, Palo Alto; Donald L. Wollesen, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/484,634

(22) Filed: Jan. 18, 2000

(51) Int. Cl.$^7$ .................................................. H01L 29/00
(52) U.S. Cl. .............................. 257/347; 257/59; 257/60; 257/61; 257/62; 257/63; 257/64; 257/65; 257/66; 257/347; 257/348; 257/349; 257/350; 257/351; 257/352; 257/353; 257/354; 257/355
(58) Field of Search ........................ 357/59–66, 347–355

(56) References Cited

U.S. PATENT DOCUMENTS 5,578,865   11/1996   Vu et al. .
5,821,559 * 11/1998   Yamazaki et al. ................... 257/368
5,877,046    3/1999   Yu et al. .

FOREIGN PATENT DOCUMENTS

2233822 * 12/1989 (GB) ................................... 257/347

* cited by examiner

Primary Examiner—Fetsum Abraham
(74) Attorney, Agent, or Firm—Renner, Otto, Boisselle & Sklar, LLP

(57) ABSTRACT

A silicon on insulator (SOI) device includes an electrically-conducting interface region along a portion of the interface between the insulator and a semiconductor layer atop the insulator. The electrically-conducting interface region provides a "leaky" electrical coupling between the body and source regions of a transistor device such as a "MOSFET", thereby reducing floating body effects of the device. A method of forming such a semiconductor device includes forming the electrically-conducting interface region by damaging or implanting materials in the insulator and/or the semiconductor in the vicinity of the interface therebetween. The method may include producing a stepped interface region, such as by etching, in order to aid properly locating the transistor device relative to the electrically-conducting interface region.

18 Claims, 10 Drawing Sheets

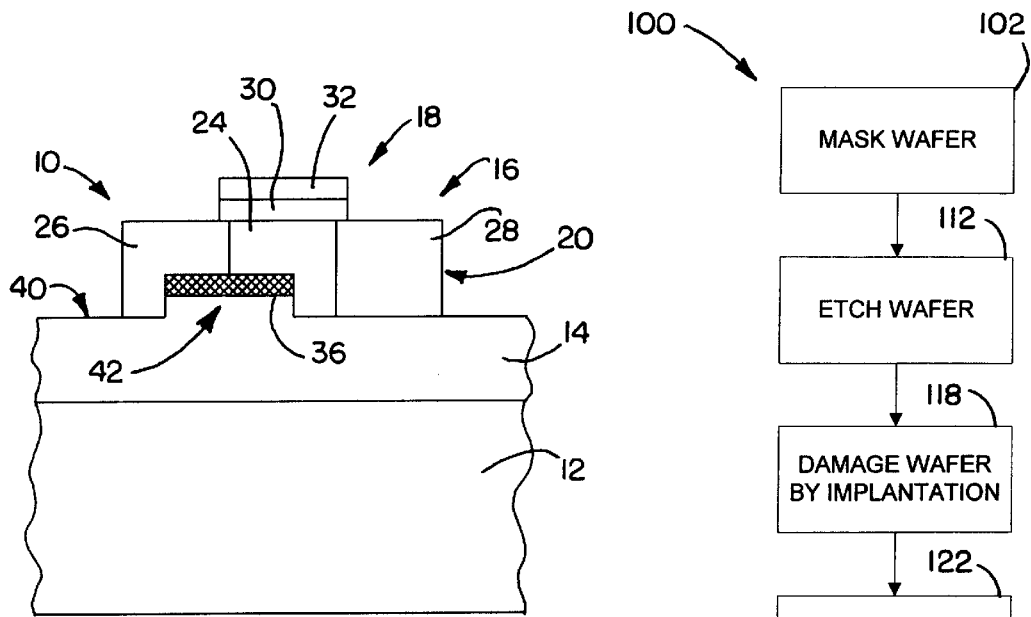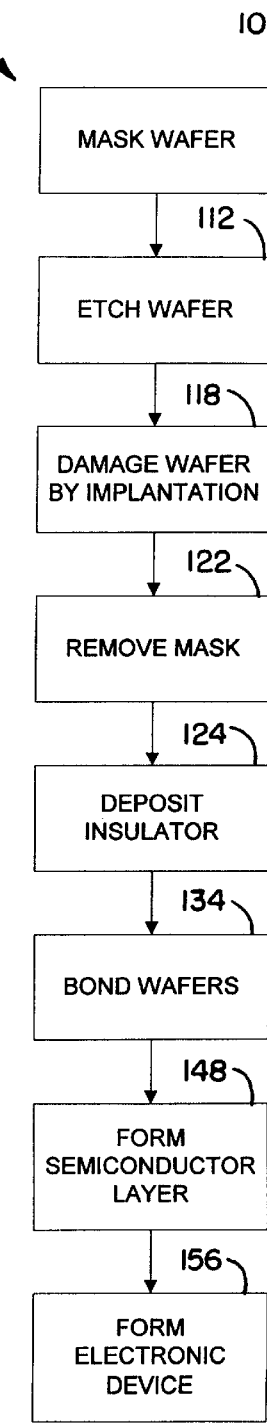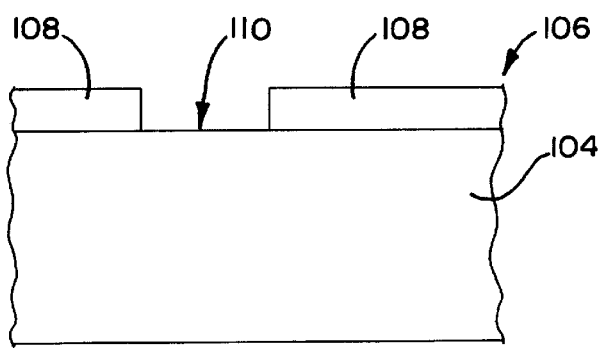
FIG. 1
FIG. 3
FIG. 2

LEAKY LOWER INTERFACE FOR REDUCTION OF FLOATING BODY EFFECT IN SOI DEVICES

BACKGROUND OF THE INVENTION

TECHNICAL FIELD OF THE INVENTION

The invention relates generally to silicon-on-insulator (SOI) devices and methods for forming the same. The invention relates particularly to SOI devices and methods for forming which avoid or reduce floating body effects.

BACKGROUND OF THE PRIOR ART

Silicon on insulator (SOI) materials offer potential advantages over bulk materials for the fabrication of high performance integrated circuits. Dielectric isolation and reduction of parasitic capacitance improve circuit performance, and eliminate latch-up in CMOS circuits. Compared to bulk circuits, SOI is more resistant to radiation. For example, silicon-on-sapphire (SOS) technology has been successfully used for years to fabricate radiation-hardened CMOS circuits for military applications. Circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body ("floating body effects"). The partially-depleted devices are such that the maximum depletion width in the body is smaller than the thickness of the semiconductor Si layer, and a quasi-neutral region results which has a floating potential. These floating body effects may result in undesirable performance in SOI devices.

It will be appreciated from the foregoing that a need exists for SOI MOSFETs having reduced floating body effects.

SUMMARY OF THE INVENTION

A silicon on insulator (SOI) device includes an electrically-conducting interface region along a portion of the interface between the insulator and a semiconductor layer atop the insulator. The electrically-conducting interface region provides a "leaky" electrical coupling between the body and source regions of a transistor device such as a MOSFET, thereby reducing floating body effects of the transistor device. A method of forming such a semiconductor device includes forming the electrically-conducting interface region by damaging or implanting materials in the insulator and/or the semiconductor in the vicinity of the interface therebetween. The method may include producing a stepped interface region, such as by etching, in order to aid properly locating the transistor device relative to the electrically-conducting interface region.

According to an aspect of the invention a semiconductor device includes a transistor device having a source region and a body region, the transistor device being mounted on an insulating layer, and an electrically-conducting interface region along the interface between the transistor device and the insulating layer, the electrically-conducting interface region providing an electrical connection between the body region and the source region.

According to another aspect of the invention, a method of producing a semiconductor device includes damaging all or a portion of a surface of a semiconductor wafer, and depositing an insulator on the surface.

According to yet another aspect of the invention, a method of producing a semiconductor device includes implanting a material on all or a portion of the surface of a semiconductor wafer, and depositing an insulator on the implanted surface.

According to still another aspect of the invention, a method of producing a semiconductor device includes etching a stepped region on a surface of a semiconductor wafer, forming an electrically conducting material in the region of the stepped portion, and using the stepped portion as a location guide for forming a transistor device partially upon the electrically-conducting region.

According to a further aspect of the invention, a semiconductor device includes an insulating layer made of insulating material; a semiconductor layer on the insulating layer, forming an interface therebetween, the semiconductor layer being made of a semiconductor material and including a body region of a first conductivity type and a source region of a second conductivity type, the source region adjoining the body region; and an altered interface region along at least a portion of the interface, the altered interface region electrically connecting the source region and the body region.

According to a still further aspect of the invention, a method of fabricating a semiconductor device includes the steps of forming a first wafer having a first semiconductor substrate, a first insulating layer on the semiconductor substrate, and an altered interface region along an interface between the semiconductor substrate and the insulating layer; bonding the first wafer to a second wafer having a second substrate and a second insulating layer on the substrate, the first and second insulating layers being bonded together; removing a portion of the first semiconductor substrate to leave a semiconductor thin film on the first insulating layer; and forming a body region of a first conductivity type and a source region of a second conductivity type in the thin film, the body region and the source region being electrically connected by the altered interface region.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIG. 1 is a side sectional view of a semiconductor device in accordance with the present invention;

FIG. 2 is a flow chart of a method in accordance with the present invention for forming a semiconductor device;

FIG. 3 is a side sectional view illustrating the step of the method of FIG. 2 of forming a mask on a semiconductor wafer;

DETAILED DESCRIPTION

Figure 4:
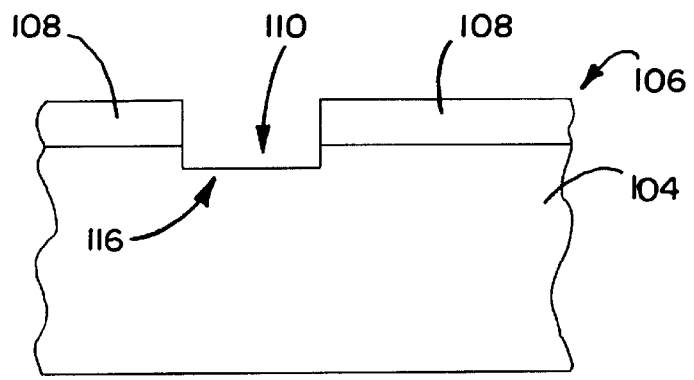
FIG. 4 is a side sectional view illustrating the step of the method of FIG. 2 of etching a semiconductor wafer.

The present invention reduces the problem of charge build up in the floating body of an SOI device such as a transistor. A "leaky" electrical connection is provided between the source of the transistor and the body of the transistor by implanting or otherwise damaging material in the vicinity of an interface between the transistor device and the insulating layer upon which the device rests.

Referring to FIG. 1, a semiconductor device 10 in accordance with the present invention is shown. The device 10 has a substrate 12 with an insulating or oxide layer 14 atop the substrate. An exemplary substrate material is silicon and an exemplary material for the insulating layer is silicon dioxide, $SiO_2$. An electronic device 16, such as a MOSFET or other transistor, is formed on the insulating layer 14. The electronic device 16 includes a gate 18 and a semiconductor layer 20, the semiconductor layer being divided into a central body 24, a source 26, and a drain 28, with the source 26 and the drain 28 adjoining the body 24 on opposite sides thereof. The gate 18 on top of the body 24 includes a gate insulator layer 30, and a gate conductor 32 on top of the gate insulator layer 30. As is conventional, the body 24 is of a different conductivity type than the source 26 and the drain 28. As is well known, an appropriate voltage may be applied to the gate conductor 32 to form a conductive channel which electrically connects the source 26 and the drain 28.

A "leaky" electrical connection between the body 24 and the source 26 is provided through an altered interface region 36 which is at or near a portion of an interface 40 between the semiconductor layer 20 and the insulating layer 14. As will be explained in greater detail below, the altered interface region 36 may be formed by implanting suitable material in either the semiconductor layer or the insulating layer 14 and/or by causing local damage to the structure of the semiconductor layer 20. References to the altered region 36 being "at" or "near" a portion of the interface 40 include situations where the altered material is within the semiconductor layer 20 or the insulating layer 14 in the near vicinity of the interface 40, such as by being vertically offset from the interface 40, thereby allowing electrical conduction substantially along the interface.

The interface 40 includes a topographically uneven region such as a stepped region 42 which corresponds in location to the altered interface region 36. The stepped region 42 aids in proper location of the transistor device 16 relative to the altered interface region 36. For example, the semiconductor layer 20 may be thin enough so that the stepped region 42 may be optically detected through the semiconductor layer.

Thus, the presence of the conducting altered interface region 36 provides an electrical path for avoidance of charge build-up in the body 24. It will be appreciated that the device 10 shown in FIG. 1 and described above is merely exemplary of semiconductor devices which have an electrically-conducting altered interface region at a semiconductor-insulating layer interface to thereby provide some form of electrical connection between the source and body of a transistor device. The altered interface region may be electrically conducting due to the presence of a dopant in the region, in the semiconductor and/or in the insulating layer. Alternatively or in addition, the altered interface region may have enhanced electrical conductivity due to damage inflicted on the structure of the semiconductor. Many variations within the present invention are described below in connection with the various methods for manufacturing such semiconductor devices. In the description below details of certain common features between the various embodiments are not repeated with regard to each of the embodiments, for the sake of brevity. It will be appreciated that features of the various embodiments may be combined with one another and may be combined with features of the embodiment described above.

FIG. 2 is a flow chart of a method 100 for constructing a semiconductor device providing a source-body electrical connection along a semiconductor-insulating layer interface. FIGS. 3–9 illustrate several of the steps of the method 100.

The method 100 begins with masking a semiconductor wafer 104 in step 102, which is illustrated in FIG. 3. The wafer 104 has a mask 106 formed thereupon, the mask 106 consisting of a plurality of mask elements 108. The wafer 104 may be made of a semiconductor material such as silicon. The mask 106 is used to confine subsequent etching and implantation to surface regions such as the region 110 which are not covered by the mask elements 108.

It will be appreciated that many well-known materials and methods exist for forming a mask on a wafer. For example, a layer of photoresist may be placed on the wafer, desired portions of the photoresist exposed to light, and either the exposed or the non-exposed regions removed through use of a solvent to thereby leave mask elements in desired locations on the wafer. Alternatively, portions of a suitable resist material may be exposed by use of an ion beam, with the exposed or non-exposed portions subsequently removed to leave mask elements in desired locations on the wafer.

In step 112, illustrated in FIG. 4, the wafer 104 is etched through use of a suitable etchant to remove a portion of the semiconductor wafer 104 from the unmasked surface region 110. Thus a topographically uneven stepped portion 116 of the wafer surface is created. The depth of the etch is preferably sufficiently great so that it is optically detectable through the remaining semiconductor (silicon) after most of the silicon of the wafer 104 is removed in a subsequent step. This subsequent step, which is described below, occurs after the wafer 104 has been bonded to another wafer. The etch, for example, may be conducted to a depth of between 500 and 1,000 angstroms, may be conducted to a depth of between 200 and 500 angstroms, may be conducted to a depth of between 150 and 250 angstroms, or may be conducted to a depth which is approximately half of the thickness of a semiconductor layer which may be subsequently formed atop the etched region, as described below. The etching may also serve to damage the structure of the silicon in the area of the etch, thereby enhancing electrical conductivity along the etched surface.

It will be appreciated that many suitable methods may be utilized for removing material to create the topographically uneven portion. Besides the wet etching described above, dry etch processes such as plasma etching, ion milling, reactive ion etching, or reactive ion beam etching, may additionally or alternatively be utilized.

Figure 5:
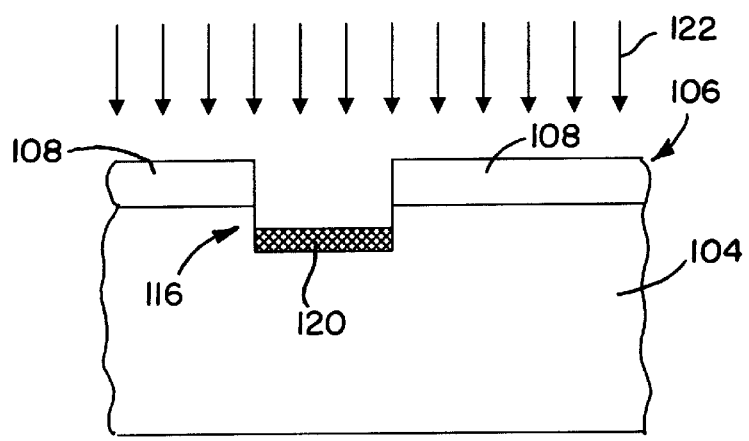
FIG. 5 is a side sectional view illustrating the step of the method of FIG. 2 of implanting a material into the semiconductor to cause damage.

Referring to FIG. 5, illustrated is a step 118 for implanting suitable materials along the unmasked portions of the wafer 104 to create an altered interface region 120. The implant, illustrated by arrows 122 in FIG. 5, involves implanting suitable ions in the silicon or other semiconductor material to damage the crystalline structure of the silicon and/or provide impurities within the silicon, to thereby increase the electrical conductivity in the altered interface region 120. A wide variety of suitable implant materials may be used. The implant materials may be electrically conductive but fairly immobile in silicon. Alternatively, the implant material may be electrically non-conductive in silicon. Further, it is desirable for the implant material to be relatively large so that it causes a relatively large amount of damage to or defects in the silicon in the altered interface region 120. The damage or defects in the crystalline structure provide pathways for electron/hole recombination, thus enhancing electrical conductivity. Exemplary implant materials include germanium, xenon, antimony and indium.

Figure 6:
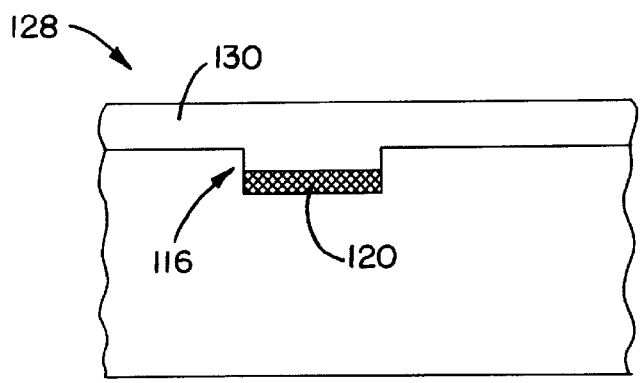
FIG. 6 is a side sectional view illustrating the step of the method of FIG. 2 of depositing an insulator on a semiconductor wafer.
Figure 7:
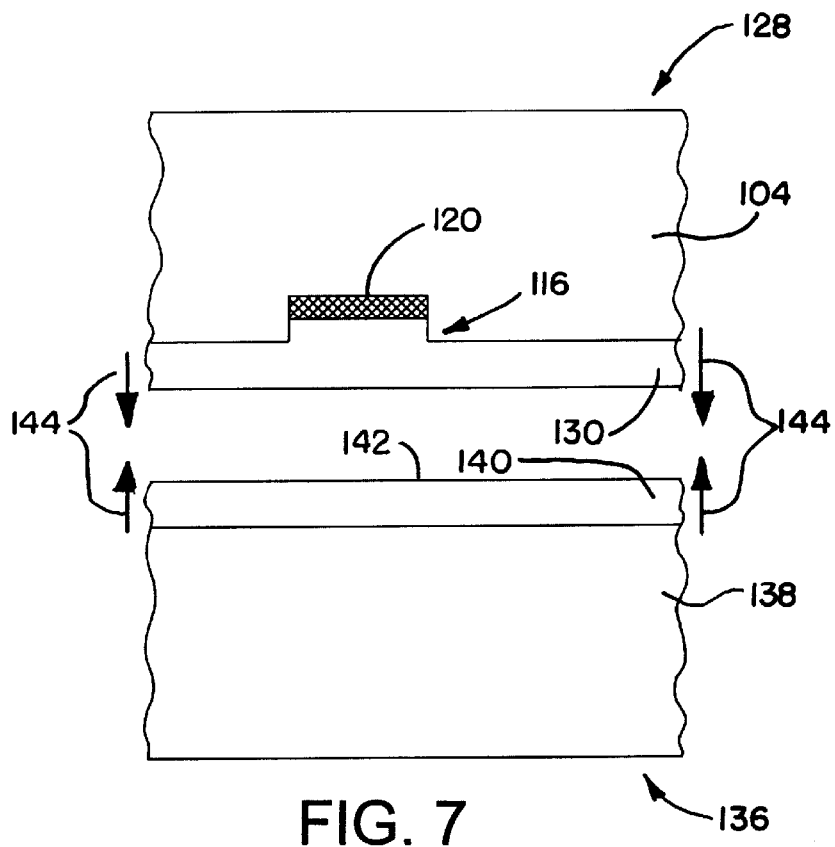
FIG. 7 is a side sectional view illustrating the step of the method of FIG. 2 of bonding two coated wafers together.

In step 122, the mask 106 is removed from the wafer 104, and in step 124 an insulating layer 130 is deposited on the wafer 104 and is polished to provide an even surface. The resulting coated wafer 128 is illustrated in FIG. 6. The insulating material layer 130 may be a layer of silicon dioxide.

It will be appreciated that the temperature used in depositing the insulating layer 130 may be kept relatively low, for example under 1100° C., in order to avoid undue undesirable migration of the implant material from the altered interface region 120 to the bulk semiconductor 104.

In step 134, the coated wafer 128 is bonded to a second coated wafer 136. The second coated wafer 136 includes a semiconductor substrate 138 and an insulating layer 140 atop the substrate, the insulating layer 140 having a top surface 142. The coated wafers 128 and 136 are bonded together at their respective insulating layers 130 and 140, as indicated by arrows 144 in FIG. 7. A bonded semiconductor device 146 is thereby formed. It will be appreciated that many suitable methods may be used to bond the coated wafers together. For example, the wafers may be pressed together in a furnace which contains an oxidizing atmosphere. Other bonding methods are well known in the art.

Figure 8:
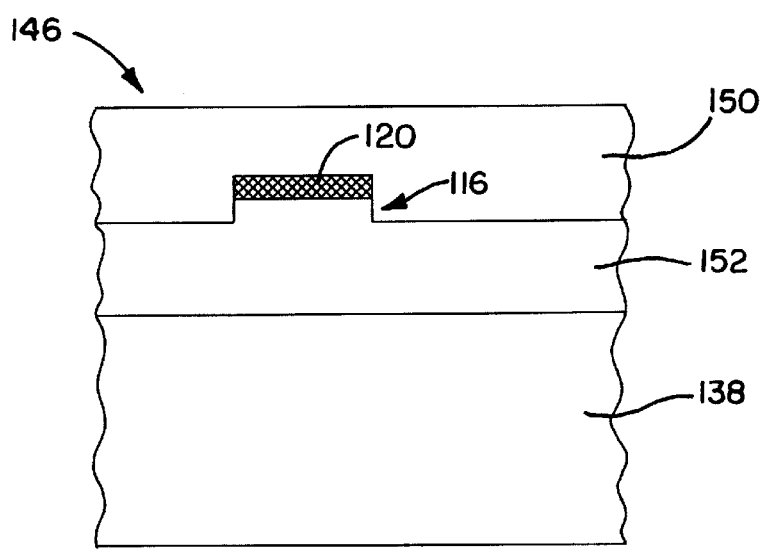
FIG. 8 is a side sectional view illustrating the step of the method of FIG. 2 of removing semiconductor material to create a semiconductor wafer.

As illustrated in FIG. 8, after the bonding to form the semiconductor device 146, in step 148 bulk silicon is removed from the semiconductor substrate 104 to leave a semiconductor layer 150 atop a combined insulator layer 152. The layer 152 is a combination of the insulating layers 130 and 140, and is shown as a single uniform layer, although it will be appreciated that the combined insulating layer may be non-uniform. Procedures for thinning bulk silicon to produce a silicon layer are well-known in the art.

Figure 9:
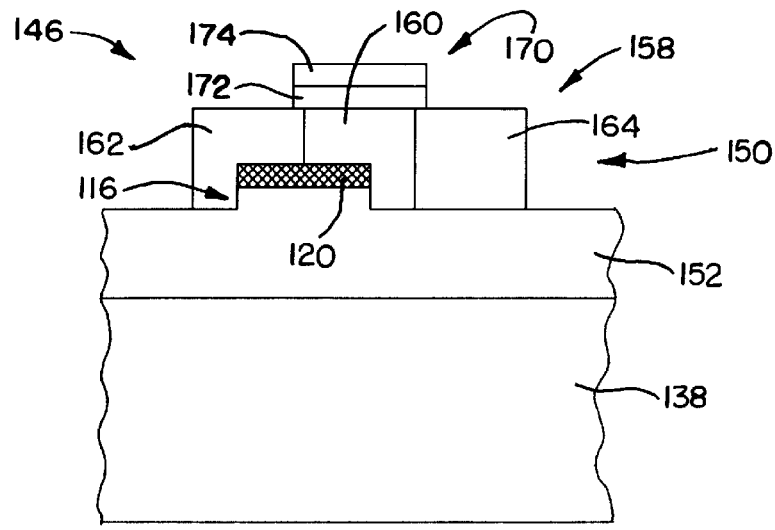
FIG. 9 is a side sectional view illustrating the step of the method of FIG. 2 of forming a transistor.

Finally in step 156, illustrated in FIG. 9, a transistor 158 is formed as part of the device 146. Parts of the semiconductor layer 150 are appropriately doped to produce a body 160, and a source 162 and a drain 164 adjoining the body on opposite sides thereof. The stepped region 116 may be used to form the transistor 158 in a proper location such that the altered interface region 120 electrically connects the body 160 and the source 162. For example, the semiconductor layer 100 may be thin enough such that the stepped region 116 is optically detectable therethrough. The body 160, the source 162 and the drain 164 are appropriately doped such that the body 160 has a different conductivity from that of the source 162 and the drain 164.

As shown in FIG. 9, portions of the semiconductor layer 150 are removed from regions adjoining the transistor 158 in order to electrically isolate the transistor from other electronic devices which are part of the semiconductor device 146. The transistor 158 includes a gate 170 formed on top of the semiconductor layer 150. The gate 170 includes an oxide layer 172 and a gate conductor 174.

Figure 10:
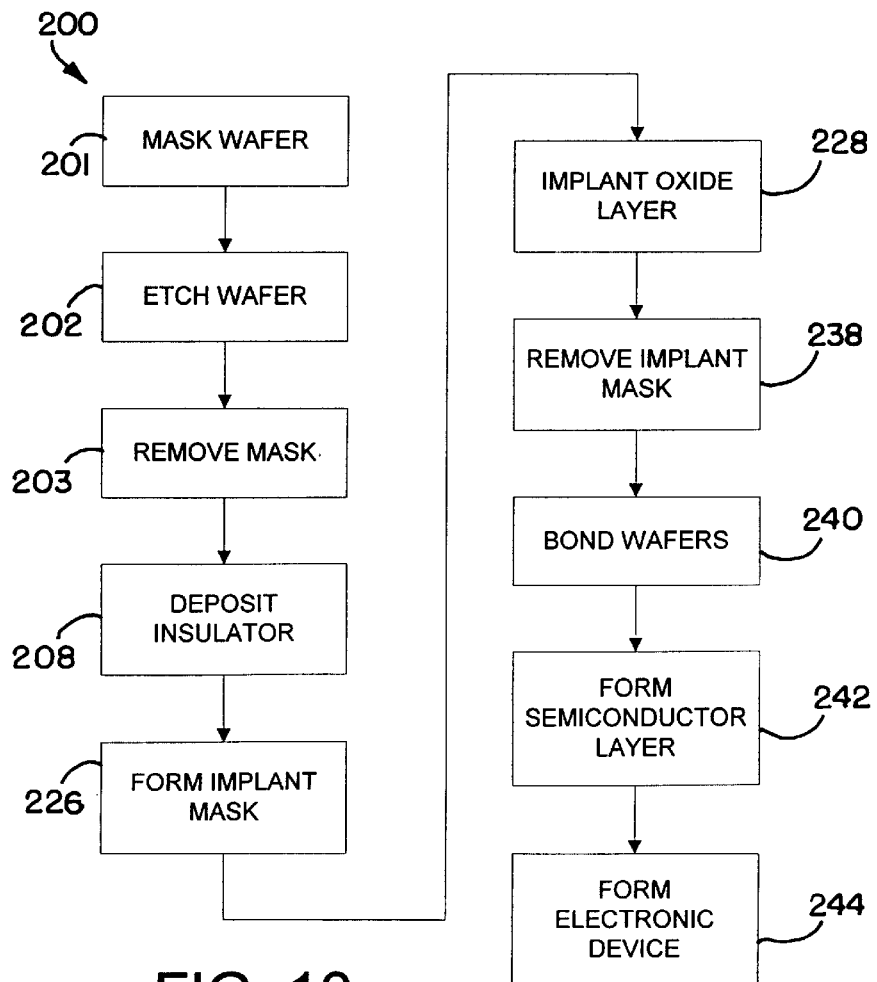
FIG. 10 is a flow chart illustrating the steps of an alternate method in accordance with the present invention of forming a semiconductor device.

FIG. 10 illustrates the steps of a method 200 for forming a semiconductor device which provides electrical connection between the body and drain portions of an electronic device such as a MOSFET. Steps 201, 202, and 203 of the method 200 are respectively, masking of a semiconductor wafer, etching of the wafer, and removal of the mask. These steps are similar to the respective steps 102, 112, and 122 described above with regard to the method 100.

Figure 11:
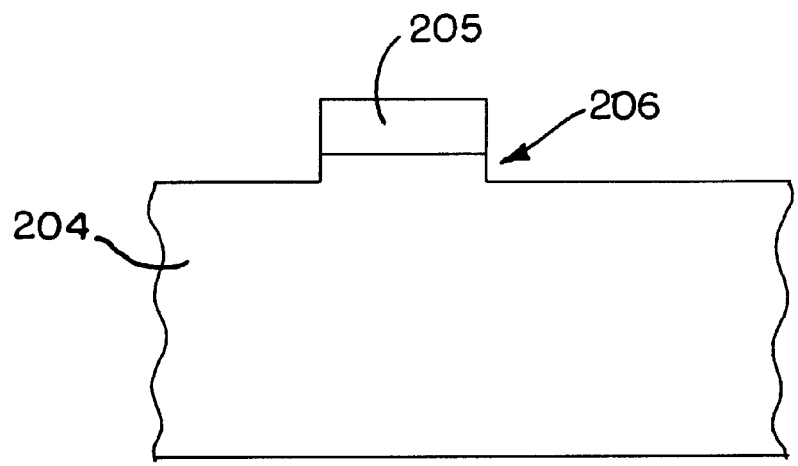
FIG. 11 is a side sectional view illustrating the steps of the method of FIG. 10 of forming a mask on a semiconductor wafer and etching the semiconductor wafer.

The results of the masking and etching steps 201 and 202 are shown in FIG. 11, wherein a semiconductor wafer substrate 204 has an etching mask 205 thereupon. Etching on the unmasked portions of the substrate 204 produces a stepped portion 206.

Figure 12:
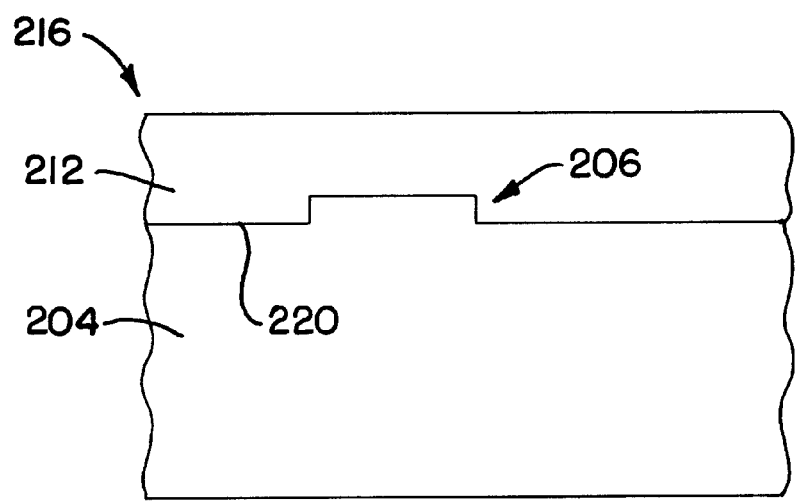
FIG. 12 is a side sectional view illustrating the steps of the method of FIG. 10 of removing the mask and depositing a layer of insulating material.

Thereafter, in step 208 an insulating layer 212 is deposited upon the semiconductor wafer substrate 204 to form the coated wafer 216 shown in FIG. 12. An interface 220 between the insulating layer 212 and the semiconductor wafer 204 includes the stepped interface portion 206, which is a raised step when compared with the remaining portion of the interface 220. An exemplary insulating or oxide layer has a thickness from about 1,000 to about 4,000 angstroms, and preferably has a thickness of between about 1,000 and about 2,000 angstroms.

Figure 13:
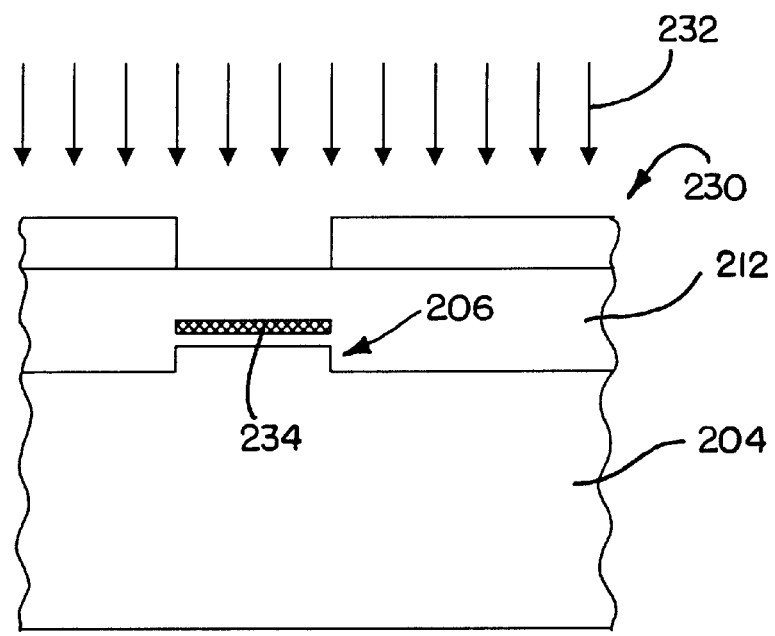
FIG. 13 is a side sectional view illustrating the steps of the method of FIG. 10 of forming an oxide layer mask and implanting material in the insulating layer to form an altered interface region.

FIG. 13 illustrates steps 226 and 228 of the method 200. The step 226 involves formation of an implantation mask 230 upon the insulating layer 212. The implantation mask 230 blocks ion implantation therethrough, thereby protecting from implantation portions of the insulating layer 212 covered by the implantation mask 230.

In step 228 implantation is made through the unmasked areas of the insulating layer 212 by ion bombardment as indicated at 232. The implantation 232 causes formation of an altered interface region 234 at or close to the stepped interface 206 between corresponding portions of the insulating layer 212 and the semiconductor wafer 204. The material for the implant 232 is selected to make the altered interface region 234 electrically conducting. An exemplary material for implanting in the insulating layer is iron atoms. Other potential materials for implanting into the insulating layer are metals such as nickel, vanadium, and titanium. It will be appreciated that the depth of the implanted material is a function of the energy of the ions 232. Preferably the altered interface region 234 is close enough to the interface 220 so as to allow the subsequently formed transistor body and source to be electrically connected. However, the implant is preferably performed so as to minimize the undesired doping of the semiconductor wafer 204 with the electrically-conductive implant material.

It will be appreciated that the stepped interface portion 206 is a portion of the wafer that was masked during the etching in step 204, the stepped interface portion 206 being a raised portion. Therefore the etching mask 205 for the etching (FIG. 11) and the implantation mask 230 are mirror images of one another. That is, what was masked during the etching in step 202 is unmasked in the implantation in step 228, and vice versa. Nevertheless, it will be appreciated that the two masks may alternatively be other than mirror images of one another, for instance only partially overlapping.

By forming the altered interface region 234 at or near the raised, as opposed to recessed, stepped interface portion 206, it will be appreciated that contamination of the wafer 204 by the implant material is less likely, due to the altered interface region 234 being further away from the non-raised portion of the interface 220. It will thus be appreciated that the altered interface region 234 may be larger or smaller than the stepped interface portion 222.

Following implantation, the implantation mask 230 is removed in step 238. Then the coated wafer 216 is bonded to another coated wafer in step 240 in a manner corresponding to the step 134 of the method 100. Thereafter semiconductor material is removed to form a semiconductor layer in step 242, which corresponds to the step 148 of the method 100.

Figure 14:
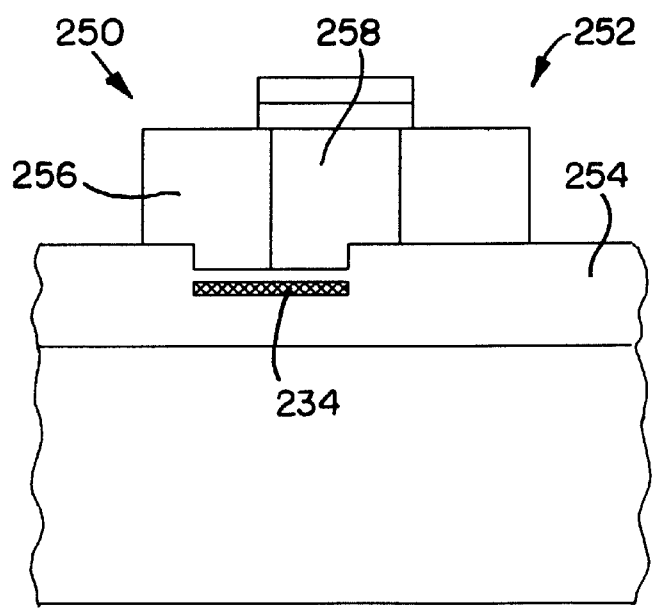
FIG. 14 is a side sectional view of the semiconductor device formed from the method of FIG. 10.

Finally, a transistor is formed in step 244. The resulting semiconductor device 250 is illustrated in FIG. 14. The device 250 has a transistor 252 formed on an insulating layer 254. The transistor 252 includes a source 256 and a body 258. The altered interface region 234 provides an electrical connection between the source 256 and the body 258, thereby preventing charge buildup in the body 258.

It will be appreciated that the stepped interface portion 206 provides a means to align the source 256 in the body 258 with the altered interface region 234.

Figure 15:
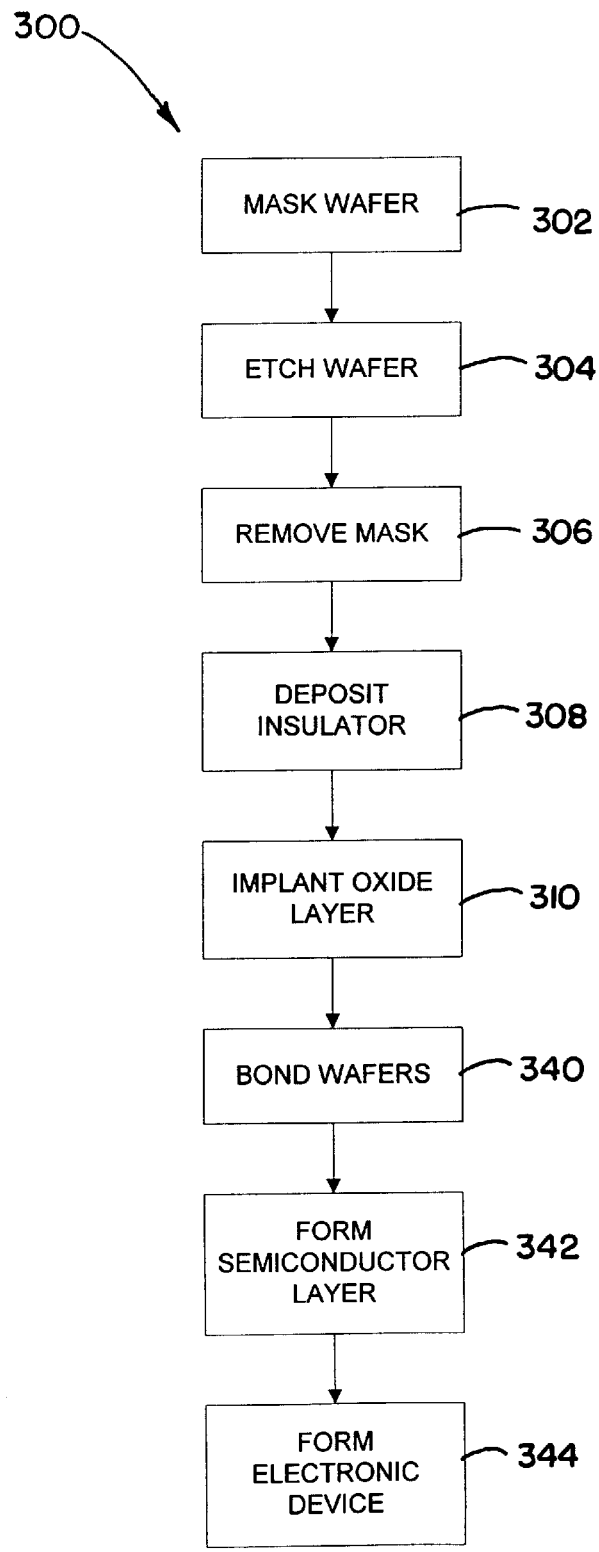
FIG. 15 is a flow chart illustrating the steps of another alternate method in accordance with the present invention of forming a semiconductor device.

FIG. 15 is a flow chart illustrating the steps of a method 300 for constructing a semiconductor device having an altered interface region electrically connecting a source and a body of an electronic device such as a transistor. The method 300 includes a step 302 of masking portions of a semiconductor wafer, a step 304 of etching unmasked portions of the wafer, a step 306 of removing the mask, and a step 308 of depositing an insulator on the partially-etched surface. The steps 302–308 may be similar to the corresponding steps of the method 200 described above.

Figure 16:
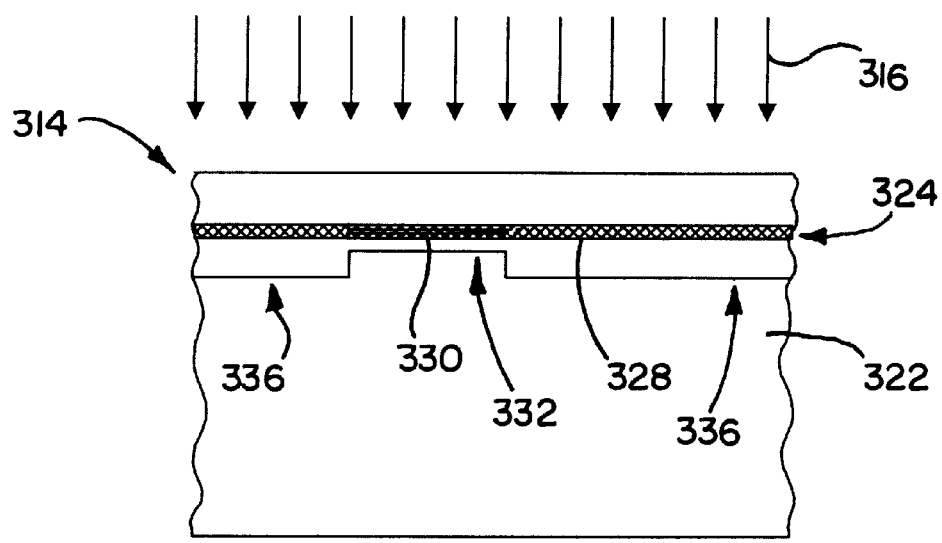
FIG. 16 is a side sectional view illustrating the step of the method of FIG. 15 of making a maskless implant on an insulator layer.

A maskless implant of the insulator is made in step 310. The maskless implant is illustrated in FIG. 16, which shows a coated wafer 314 being subjected to an ion implant 316. The wafer 314 includes a semiconductor substrate 322, and an insulating layer 324 atop the substrate. The implant 316 forms an implant region 328 within the insulating layer 324. Part of the implant region 328 is an altered interface region 330, the altered interface region being the portion of the implant region 328 that is vertically nearer a stepped interface portion 332 which is between the silicon substrate 322 and the insulating layer 324. The remainder of the implant region 328 may be sufficiently far from the remainder of the interface 336 between the semiconductor 322 and the insulating layer 324, so as to not provide electrical conduction along the remainder of the interface 336.

The method 300 includes bonding the coated wafer 314 to another wafer in step 340, removing semiconductor material in step 342, and forming a transistor device in step 344. The steps 340–344 are similar to corresponding steps in the methods 100 and 200.

Figure 17:
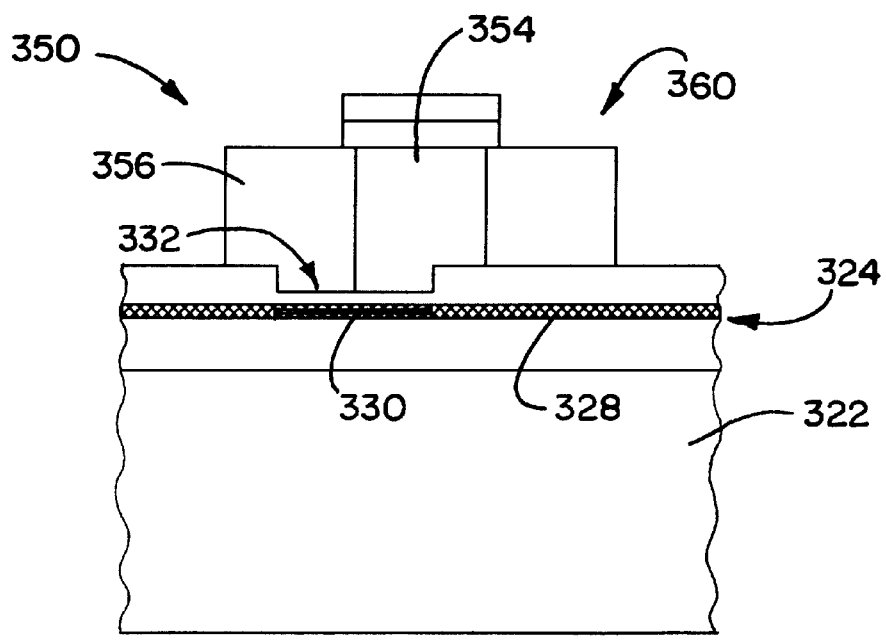
FIG. 17 is a side sectional view showing the semiconductor device formed using the method of FIG. 15.

The resulting semiconductor device 350 is shown in FIG. 17, wherein the altered interface region 330 at or near the stepped interface portion 322 provides electrical connection between a body 354 and a source 356 of a transistor 360.

It will be appreciated that the method 300 may be simpler and less costly when compared to the method 200 described above, due to the omission of the steps of forming and removing an implant mask.

Figure 18:
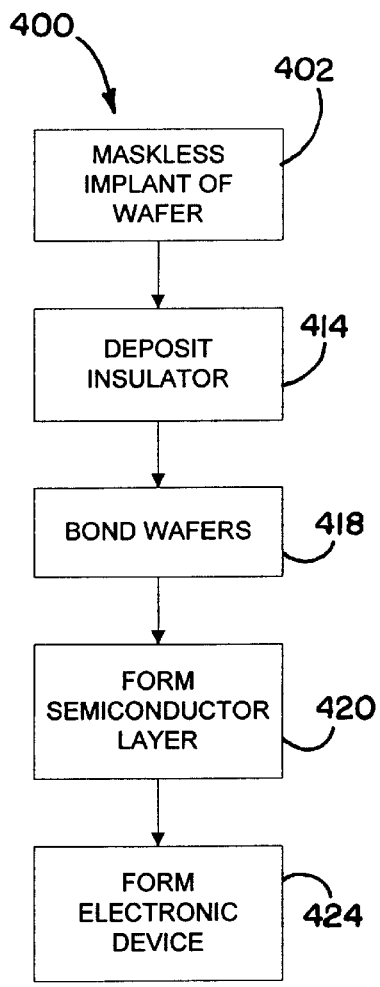
FIG. 18 is a flow chart illustrating yet another alternate method in accordance with the present invention for forming a semiconductor device.
Figure 19:
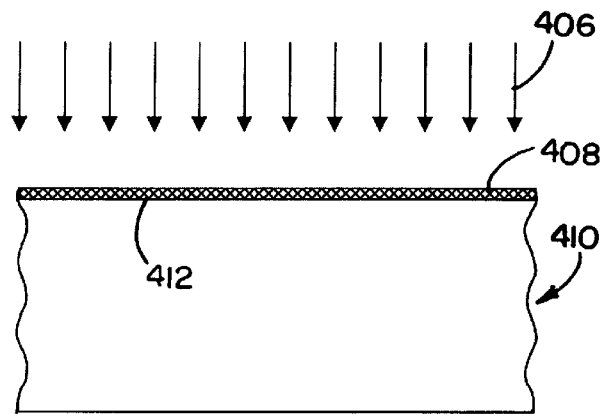
FIG. 19 is a side sectional view illustrating the step of the method of FIG. 18 of making a maskless implant on a semiconductor wafer.

FIG. 18 is a flow chart showing the steps of a method 400 for using a maskless implant to create damage and/or deposit impurities on the surface of a semiconductor wafer in order to provide electrical conductivity along the surface. The maskless implant is done in step 402, which is illustrated in FIG. 19. An implant 406 is made on a surface 408 of a wafer 410, thereby creating an altered interface region 412. It will be appreciated that the wafer material and the implanted material may be similar to those described above with regard to the methods 100, 200 and 300.

Following the implantation in step 402, an insulator is deposited on the wafer 410 in step 414. Thereafter the resulting coated wafer is bonded with another wafer in step 418, excess semiconductor material is removed in step 420, and an electronic device such as a transistor is formed in step 424. The steps 414–424 may be similar to those described earlier with regard to the other methods disclosed herein.

Figure 20:
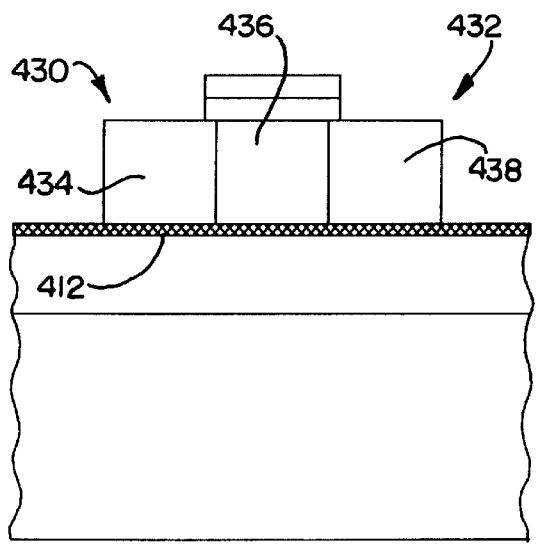
FIG. 20 is a side sectional view showing the semiconductor device formed from the method of FIG. 18.

The method 400 produces the semiconductor device 430 shown in FIG. 20. The semiconductor device 430 includes a transistor 432 having source region 434, a body region 436 and a drain region 438. The source 434 and the body 436 are electrically connected via the altered interface region 412.

It will be noted that the altered interface region 412 also electrically connects the source 434 and the drain 438. Thus some source to drain leakage is expected through the interface region 412. However, the induced leakage may be tolerable in some circumstances and for some applications. For example, such leakage may be tolerable if it is less than the transistor offstate sub-threshold leakage.

It will be appreciated that the method 400, by providing a uniform, maskless implant, has the advantage of requiring fewer steps than some of the earlier-described methods. It also advantageously removes the need to accurately place transistors relative to altered interface regions, because a uniform altered interface region is provided over large areas of the wafer.

Figure 21:
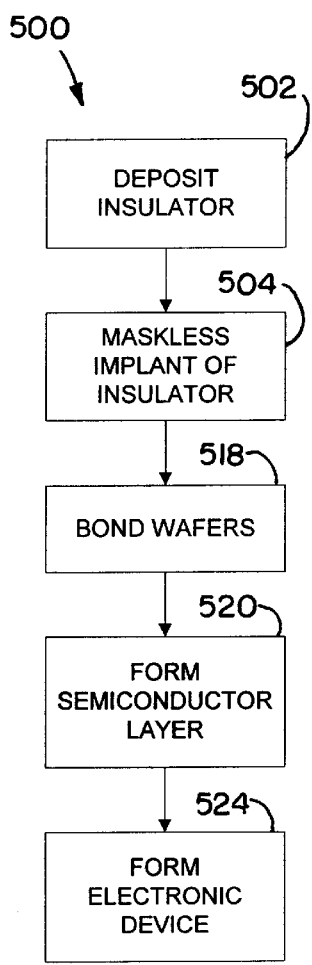
FIG. 21 is a flow chart illustrating still another alternate method in accordance with the present invention for forming a semiconductor device.

FIG. 21 shows the steps of a method 500 which also includes a maskless implant, the maskless implant of the method 500 being an implant through an insulator layer.

Figure 22:
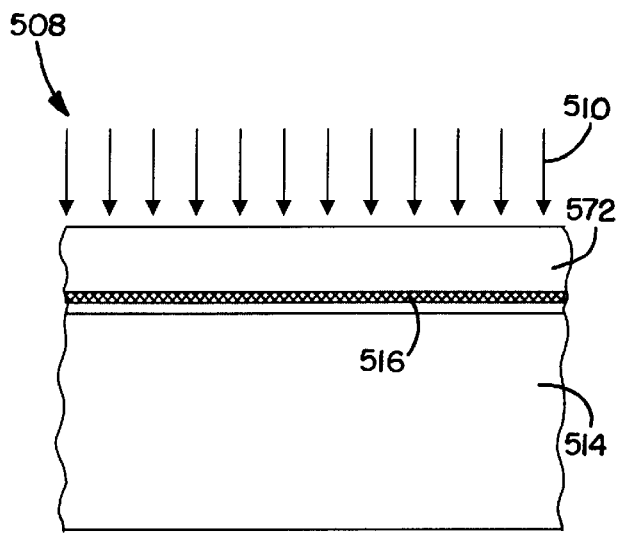
FIG. 22 is a side sectional view illustrating the step of the method of FIG. 21 of making a maskless implant through an insulating layer.

After an insulator layer is deposited on a semiconductor wafer in step 502, a material is implanted into the insulating layer in step 504. The maskless implant of step 504 is illustrated in FIG. 22, wherein a coated wafer 508 is subjected to an implant 510 through an insulating layer 512 of the coated wafer which is atop a semiconductor substrate 514. The implant 510 forms an implant region 516 in the insulating layer 512. The material for the implant 510 may be similar to that for the implant 228 of the method 200 and the implant 310 of the method 300.

Figure 23:
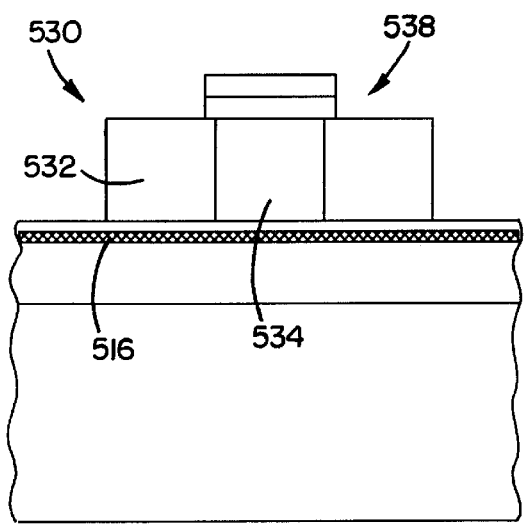
FIG. 23 is a side sectional view showing a semiconductor device formed using the method of FIG. 21.

Following the implanting in step 504, the method 500 includes bonding the coated wafer to another coated wafer in step 518, removing excess semiconductor in step 520, and forming a transistor in step 524. The steps 518–524 are similar to corresponding steps in the other methods. The resulting semiconductor device 530 is shown in FIG. 23, wherein the implant region 516 electrically connects a source 532 and a central body 534 of a transistor 538.

The invention described above thus encompasses a wide variety of semiconductor devices and methods of fabrication which overcome the floating body problem inherent in many SOI devices by providing a leaky source-body connection along the interface between an underlying insulator and the source and body.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the varius functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor device comprising:

an insulating layer made of insulating material;

a semiconductor layer on the insulating layer, forming an interface therebetween, the semiconductor layer being made of a semiconductor material and including a body region of a first conductivity type and a source region of a second conductivity type, the source region adjoining the body region; and an altered interface region along at least a portion of the interface between the semiconductor region and the insulating layer, the altered interface region electrically connecting the source region and the body region.

2. The device of claim 1, wherein the altered interface region includes an insulation implant material implanted in a portion of the insulating material.

3. The device of claim 2, wherein the insulation implant material is selected from a group consisting of iron, nickel, vanadium, and titanium.

4. The device of claim 1, wherein the altered interface region includes a semiconductor implant material implanted in the semiconductor material.

5. The device of claim 4, wherein the semiconductor implant material is selected from a group consisting of germanium, xenon, antimony, and indium.

6. The device of claim 4, wherein the altered interface region is limited to a bottom portion of the semiconductor material.

7. The device of claim 1, wherein the altered interface region is along substantially all of the interface.

8. The device of claim 1, wherein the altered interface region is along a part of the interface which corresponds to the body region and the source region, and wherein the altered interface region is underneath at least part of the body region and is underneath at least part of the source region.

9. A semiconductor device comprising:

an insulating layer made of insulating material;

a semiconductor layer on the insulating layer, forming an interface therebetween, the semiconductor layer being made of a semiconductor material and including a body region of a first conductivity type and a source region of a second conductivity type, the source region adjoining the body region; and an altered interface region along at least a portion of the interface between the semiconductor region and the insulating layer, the altered interface region electrically connecting the source region and the body region;

wherein the interface has a topographically uneven stepped region.

10. The device of claim 9, wherein the stepped region corresponds in location to the body region and the source region.

11. The device of claim 10, wherein the stepped region includes a raised region which protrudes into the body region and the source region.

12. The device of claim 10, wherein the stepped region includes a recessed region which protrudes into the insulating layer.

13. The device of claim 9, wherein the altered interface region is along a part of the interface which corresponds to the stepped region.

14. The device of claim 13, wherein the altered interface region includes an insulation implant material implanted in a portion of the insulating material.

15. The device of claim 13, wherein the altered interface region includes a semiconductor implant material implanted in the semiconductor material.

16. The device of claim 9, wherein the stepped region differs in level from the remainder of the interface region by between 500 and 1000 angstroms.

17. The device of claim 9, wherein the stepped region differs in level from the remainder of the interface region by approximately half of a thickness of the semiconductor layer.

18. The device of claim 9, wherein the altered interface region is along substantially all of the interface.

* * * * *